(12) United States Patent
Drewery et al.

(10) Patent No.: US 11,150,708 B2
(45) Date of Patent: Oct. 19, 2021

(54) COOLING SYSTEM CONTROL COMPONENT

(71) Applicant: International Business Machines Corporation, Armonk, NY (US)

(72) Inventors: Sarah Michelle Drewery, Southampton (GB); Colin Ian Holyoake, Braishfield (GB); Richard Postlethwaite, Salisbury (GB)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/695,738

(22) Filed: Nov. 26, 2019

(65) Prior Publication Data

US 2021/0157375 A1     May 27, 2021

(51) Int. Cl.
  *G06F 1/20*    (2006.01)
  *H05K 7/20*    (2006.01)
(52) U.S. Cl.
  CPC .............. *G06F 1/203* (2013.01); *G06F 1/206* (2013.01); *H05K 7/20145* (2013.01); *H05K 7/20172* (2013.01); *H05K 7/20209* (2013.01)
(58) Field of Classification Search
  None
  See application file for complete search history.

(56) References Cited

U.S. PATENT DOCUMENTS

| 8,131,498 | B1 * | 3/2012 | McCauley | ........... | A63B 26/003 |
| | | | | | 702/139 |
| 10,025,360 | B2 * | 7/2018 | Nanda | ..................... | G06F 1/203 |
| 10,178,797 | B1 | 1/2019 | Michael | | |
| 2003/0220721 | A1 * | 11/2003 | Cohen | ..................... | G06F 1/203 |
| | | | | | 700/301 |
| 2006/0193113 | A1 * | 8/2006 | Cohen | ..................... | G06F 1/203 |
| | | | | | 361/679.48 |
| 2008/0059004 | A1 * | 3/2008 | Katoh | ................ | G05D 23/1919 |
| | | | | | 700/300 |
| 2009/0194209 | A1 * | 8/2009 | De Filippis | ............ | A45C 11/00 |
| | | | | | 150/107 |
| 2009/0289958 | A1 * | 11/2009 | Kim | ..................... | G06F 3/04886 |
| | | | | | 345/649 |
| 2012/0130545 | A1 * | 5/2012 | Haugh | .................... | G06F 1/203 |
| | | | | | 700/276 |
| 2013/0166094 | A1 * | 6/2013 | Eckberg | ............. | H05K 7/20736 |
| | | | | | 700/300 |

(Continued)

OTHER PUBLICATIONS

Amazonbasics, "AmazonBasics Ventilated Adjustable Laptop Stand", Amazon, Date First Available: May 1, 2015, Accessed on Sep. 25, 19, 8 pages, <https://www.amazon.co.uk/AmazonBasics-Ventilated-Adjustable-Laptop-Stand/dp/B00WRDS8H0/ref=sr_1 _5>.

(Continued)

*Primary Examiner* — Santosh R Poudel
(74) *Attorney, Agent, or Firm* — Stephen R. Yoder (57) ABSTRACT

A system for a cooling control component for a computing device is provided. A computing device monitors weight distribution from data received from one or more sensors distributed on a base of the housing of the computing device. A computing device determines that the weight distribution is uneven for a defined period of time. A computing device executes a first overheating prevention measure that uses a hardware operation profile to reduce heat generation.

17 Claims, 5 Drawing Sheets

(56) References Cited

U.S. PATENT DOCUMENTS

| | | | |
|---|---|---|---|
| 2014/0160657 A1* | 6/2014 | Morrison | G06F 1/166 361/679.21 |
| 2018/0217660 A1* | 8/2018 | Dayal | G06N 20/00 |
| 2018/0284858 A1* | 10/2018 | Lee | G06F 1/1656 |
| 2019/0129480 A1 | 5/2019 | Jeff | |
| 2019/0239384 A1* | 8/2019 | North | G06F 1/3206 |

OTHER PUBLICATIONS

Disclosed Anonymously, "Extended Cooling For Laptop Computers via Thermally Induced Flow-Heat Loop", IP.Com, IPCOM000223137D, Publication Date: Nov. 5, 2012, 4 pages.

HP, "HP Notebook PCs—Reducing Heat Inside the Laptop to Prevent Overheating", HP Support, Accessed Sep. 25, 2019, 9 pages, <https://support.hp.com/GB-en/document/c01657439>.

Klimtechs, "KLIM Cool", Klimtechs Product, Captured Feb. 13, 2019, 4 pages, <https://web.archive.org/web/20190213054055/https://klimtechs.com/product/klim-cool/>.

Kramer, L., "There's Danger of Fire or Severe Burns From Laptop Computers and Other Electronics", Burn Injury Resource Center, Feb. 28, 2012, 3 pages, <https://www.burn-injury-resource-center.com/fire-danger-from-laptop-comput/>.

Opolar, "Laptop Fan Cooler with Temperature Display, Rapid Cooling, Auto-Temp Detection, 13 Wind Speed, Perfect for Gaming Laptop, Nintendo Switch", Amazon UK, Date first available May 5, 2016, 16 pages, <https://www.amazon.co.uk/dp/B01E3Q7FS6/ref=asc_df_B01E3Q7FS658476898/?tag=googshopuk-21 &creative=22146&creativezSIN=B01E3Q7FS6&linkCode=df0&hvadid=309947853784&hvpos=1o1&hvnetw=g&hvrand=15819076630267295355z&hvpone=&hvptwo=&hvqmt=&hvdev=c&hvdvcmdl=&hvlocint=&hvlocphy=1007044&hvtargid=pla-406302676505>.

Pinola, M., "How to Test Your Computer's CPU Temperature", Lifewire, Updated Sep. 3, 2019, 3 pages, <https://www.lifewire.com/how-can-i-test-laptop-temperature-2377618>.

Preece, R., "Best laptop cooling pad: Stop your gaming or work laptop overheating with the best cooling mats", Expert Reviews, Sep. 17, 2019, 17 pages, <https://www.expertreviews.co.uk/laptops/1407445/best-laptop-cooling-pad>.

Wikipedia, "Laptop Cooler", Wikipedia, last edited on Mar. 12, 2019, 3 pages, <https://en.wikipedia.org/wiki/Laptop_cooler>.

* cited by examiner

COOLING SYSTEM CONTROL COMPONENT

BACKGROUND

The present invention relates to computing devices and, more specifically, to a cooling system control component for a computing device.

Computing devices get hot when they are switched on and their hardware components are active. The cooling systems, such as cooling fans, require airflow into and out of the housing and such ventilation areas are usually disposed near the bottom of the unit.

As technology demands more from hardware, there is an increase in heat produced and an increase in risk of overheating that can lead to fires.

SUMMARY

Embodiments of the present invention provide a method, system, and computer program product for a system for a cooling control component for a computing device.

A first embodiment encompasses a method for managing a system for a cooling control component for a computing device. One or more processors monitor a computing device weight distribution from data received from one or more sensors distributed on a base of a housing of the computing device. One or more processors determine that the weight distribution is uneven for a defined period of time. One or more processors execute a first overheating prevention measure to initiate a hardware operation profile to minimize heat generation.

A second embodiment encompasses a computer system for managing a system for a cooling control component for a computing device. The computer system includes one or more computer processors, one or more computer-readable storage medium, and program instructions stored on the computer-readable storage medium for execution by at least one of the one or more processors. The computer program product includes one or more computer-readable storage media and program instructions stored on the one or more computer-readable storage media. The program instructions include program instructions to monitor a computing device weight distribution from data received from one or more sensors distributed on a base of a housing of the computing device. The program instructions include program instructions to determine that the weight distribution is uneven for a defined period of time. Program instructions include program instructions to execute a first overheating prevention measure to initiate a hardware operation profile to minimize heat generation.

A third embodiment encompasses a computer program product for a system for executing a video summary is managed. The computer program product includes one or more computer-readable storage media and program instructions stored on the one or more computer-readable storage media. The program instructions include program instructions to monitor a computing device weight distribution from data received from one or more sensors distributed on a base of a housing of the computing device. The program instructions include program instructions to determine that the weight distribution is uneven for a defined period of time. Program instructions include program instructions to execute a first overheating prevention measure to initiate a hardware operation profile to minimize heat generation.

The computer readable storage medium may be a non-transitory computer readable storage medium and the computer readable program code may be executable by a processing circuit.

It will be appreciated that for simplicity and clarity of illustration, elements shown in the FIGS. have not necessarily been drawn to scale. For example, the dimensions of some of the elements may be exaggerated relative to other elements for clarity. Further, where considered appropriate, reference numbers may be repeated among the FIGS. to indicate corresponding or analogous features.

DETAILED DESCRIPTION

A computing device cooling system control is described. The cooling system control uses data from multiple weight sensors provided on an underneath base surface of the computing device to determine if the computing device is on an untrusted surface that is soft and unstable which inhibits airflow to or from a cooling system of the computing device resulting in overheating.

Computing device placed on a hard surface are able to take in external air to their cooling system in order to cool the computer down. However, with the convenience of movement and use of computing devices, they are often left on beds or other soft surfaces, which cover the airflow inlets and/or outlets. This often prevents the ventilation areas from functioning properly and traps the heat in the housing. If a computing device is left unattended on a soft surface such as a blanket or a duvet, it can get hot resulting in damage to the computing device and can burn the surface causing a fire hazard.

The cooling system control automatically detects whether the computing devices is on an untrusted surface and, if so, it activates one or more of the described overheating preventative measures.

In various embodiments of the present invention, an overheating preventative measure is to use hardware operating profiles of the computing device to reduce clock cycles, increase fan speeds, and generally reduce heat production.

In alternative embodiments, a second overheating preventative measure is to change the direction of airflow through the computing device to allow it to vent freely without any obstructions. In some embodiments, airflow may alternate from one, or a combination of flowing into the untrusted surface, upwards out of the computing device or from the lateral sides of the computing device. This could be done simply with a sliding cover which is moveable to redirect the heat upwards or sideways instead of downwards.

In some embodiments, an overheating preventative measure is to use a supplementary cooling system in the computing device, such as a secondary fan or a standby fan, which may also use a different airflow path.

In various embodiments, one or a combination of some or all options of overheating preventative measures above may be used as the heat production increases. The measures may be activated in different orders depending on the configuration of a system.

Figure 1:
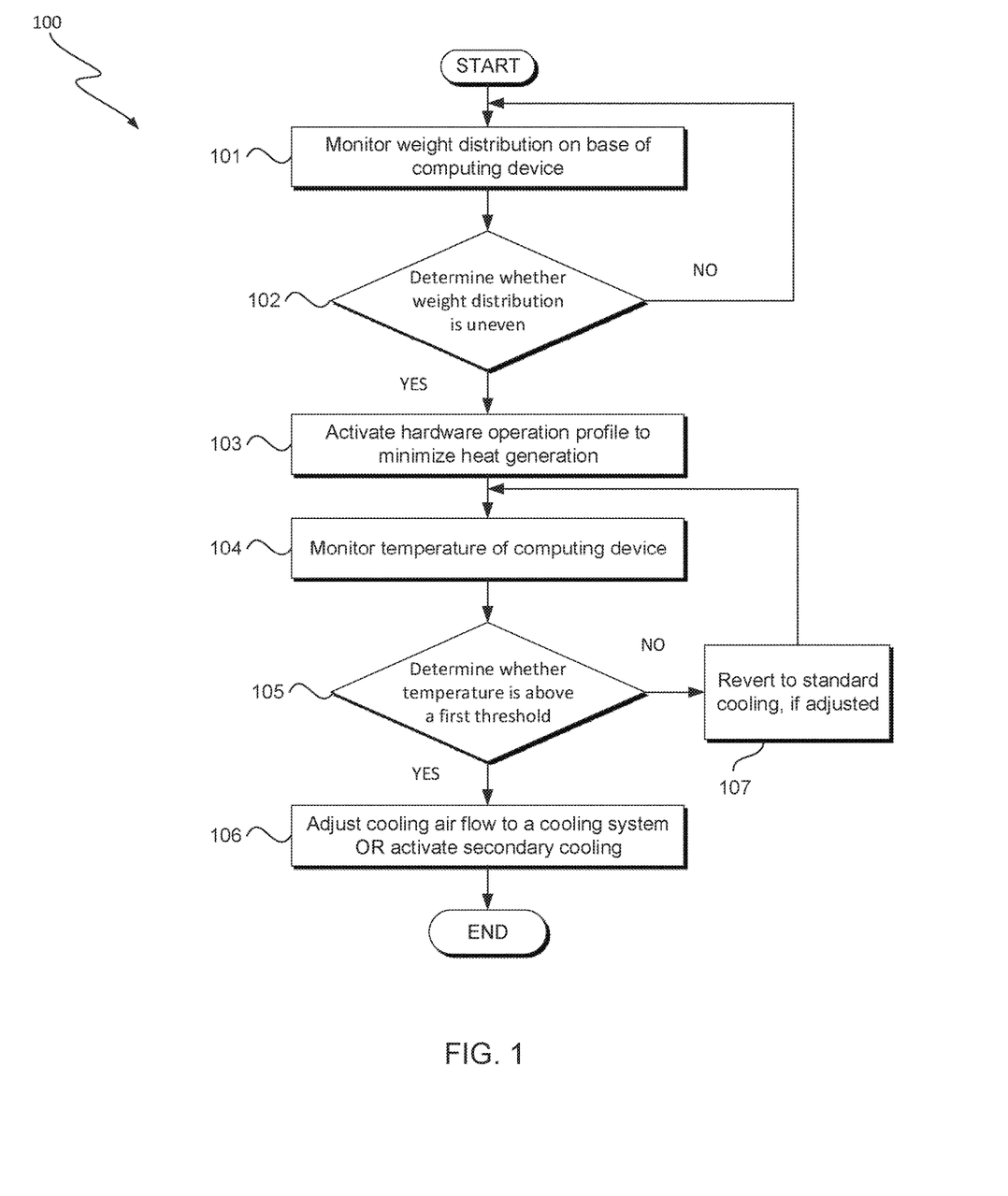
FIG. 1 illustrates operational processes of a method of cooling system control, on a computing device, in accordance with an exemplary embodiment of the present invention.

Referring to FIG. 1, a flow diagram 100 shows an example embodiment of the described cooling system control for a computing device.

In various embodiments, a computing device may include a cooling system control component for performing the described method, which may be provided as part of its operating system software or as a separate application installable on the computing device or accessed remotely.

In operation 101, the method actively monitors a computing devices weight distribution from data received from a plurality of weight sensors disposed in a base of the computing device. It may be determined, in operation 102, if the weight distribution is uneven for a defined period of time.

In operation 102, the method determines that the weight distribution is uneven for a defined period of time and compares the weight data from each of a plurality of pressure sensors in a base of the computing device to determine weight differences between the pressure sensors and to determine if a weight difference is greater than a threshold difference for a sustained period of time (operation 102, YES branch).

If the weight distribution is not determined to be uneven, the method may loop to continue monitoring the weight distribution of the computing device (operation 102, NO branch). This may run as a background process during operation of the computing device.

If the weight distribution is determined to be uneven in operation 102, the method may trigger a first overheating prevention measure. In various embodiments, the first overheating prevention measure is to activate a hardware operation profile to minimize heat generation (operation 103).

However, it may be that the control component is configured with a different first overheating prevention measure such as changing a direction of airflow of a cooling system as described further below or activating a supplementary cooling system. This may be configured if a user does not want to use a hardware operation profile that minimizes heat generation as a user of the computing device wishes to utilize the full processing capacity of the computing device.

In operation 104, the method actively monitors for a threshold value temperature fluctuation of the computing device from data received from a temperature sensor within the housing of the computing device. In various embodiments of the present, operation 104 may take place simultaneously with operation 101 to determine if an uneven surface is having a detrimental effect on the cooling system of the computing device.

In one embodiment, the method monitors a threshold value temperature fluctuation of the computing device in response to the hardware operation profile being activated to determine whether the profile is maintaining constant temperature value at a defined level. In some embodiments, the defined level is set by the manufacturer. In an alternative embodiment, the user sets the defined level.

In operation 105, the method determines if the temperature value exceeds a first threshold temperature and, if so, it may trigger a second overheating prevention measure different to the first overheating prevention measure (operation 105, YES branch). In this embodiment where the first overheating prevention measure is activating a hardware operation profile, the second prevention measure may be to adjust a cooling airflow to an existing cooling system or activating a supplementary cooling system (operation 106).

In various embodiments, if it is determined that the temperature value is not above a first threshold, the method continues to monitor the temperature (operation 105, NO branch). In some embodiments, the method detects an additional second temperature threshold, below the first temperature threshold, that is used to determine if the temperature has decreased to a second threshold temperature in order to cease the overheating prevention measures and revert to standard cooling (operation 107).

Figure 2A:
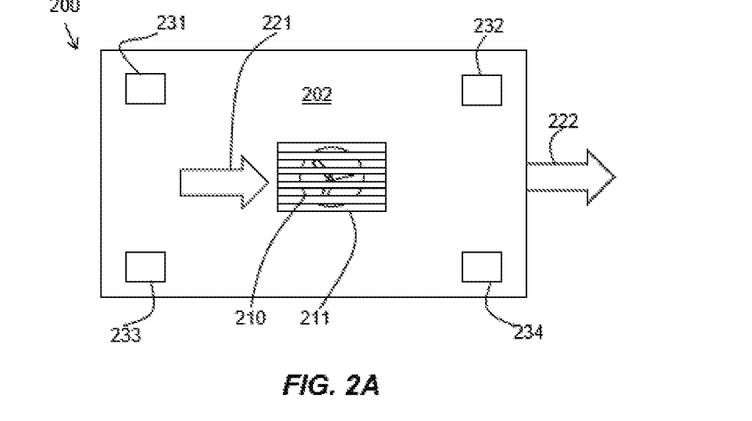
FIG. 2A is a schematic diagram of an underside of a computing device, in accordance with an exemplary embodiment of the present invention.
Figure 2B:
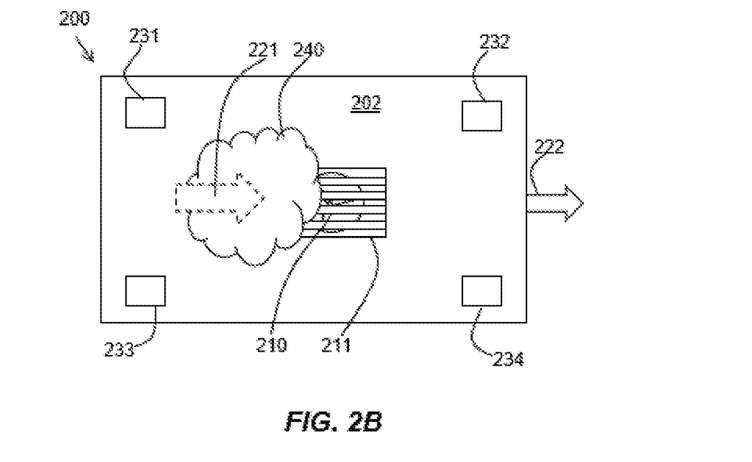
FIG. 2B is a schematic diagram of an underside of a computing device with an object inhibiting a cooling system of the computing device, in accordance with an exemplary embodiment of the present invention.

FIGS. 2A and 2B represent the underside of housing 202 of a computing device 200 and are depicted with a cooling system in the form of a recessed fan 210 behind a grill 211. The present depiction is for illustrative simplicity, and further, the present invention can include various alterations without departing from the scope of the invention. In various embodiments, grill 211 includes, but is not limited to, an inlet, a grate, etc. for cooling ambient temperatures with outlet 222 being provided on a lateral side of the computing device housing 202. The present invention recognizes that various orientations of inlets and outlets for airflow to a cooling system of a computing device are known and these are generally disposed either on an underside of computing device housing 202 or in a side panel of computing device housing 202. The present invention recognizes that airflow 221 is depicted for illustrative simplicity and is denoted by the directional arrow in FIGS. 2A and 2B.

The underside of computing device housing 202 may have equidistantly spaced weight sensors 231, 232, 233, 234 from the focal point of computing device housing 202. In one embodiment and example, the weight sensors 231, 232, 233, 234 are provided that about one or more corners of computing device housing 202.

In FIG. 2A, it is assumed that the computing device is on a trusted firm surface and each of the weight sensors 231, 232, 233, 234 may measure a threshold value indicating an even distribution of weight. In one embodiment and example, weights sensors 231, 232, 233, 234 (hereinafter referred to as weight sensors 231-234) measure 500$g$ value indicating an even distribution of weight.

In FIG. 2B, it is assumed that the computing device is on an untrusted soft surface 240 and each of the weight sensors 231-234 measure varying weight values that indicate an uneven distribution of weight. In one embodiment and example, weights sensors 231-234, wherein sensor 231 reading 345$g$, sensor 232 reading 256$g$, sensor 233 reading 363$g$ and sensor 234 reading 126$g$ indicating an uneven distribution of weight.

In various embodiments, if approximate equal weight is detected at each sensor, normal airflow direction persists, for example, from an underside to a side exit and the computing device processor will be able to be operated to full capacity without overheating.

In some embodiments, if weight sensors 231-234 detect varying weight values at locations distributed computing device housing 202, then the control system detects inconsistent weight distribution. In some embodiments, the control system determines that the computing device housing 202 is taking load (for example, from a duvet) and there is a risk of the airflow to the cooling fans being obstructed. In such a case, the processor may be restricted using a hardware operating profile to a maximum of, for example, 50% capacity until measurements have balanced out.

In various embodiments, once weight sensors 231-234 detect weight distribution as untrusted, the computing device uses a hardware operation profile to reduce clock cycles and hardware heat generation, allowing support of basic system operations whilst attempting to maintain safe working temperatures. The present invention recognizes that most operating systems come with pre-defined and customizable profiles such as high performance, balanced, energy saver, etc.

In various embodiments, if the temperature cannot be managed effectively or if such limitation on the processor capacity is not desired, then a new airflow path is opened, for example, by altering a cover and pulling in air from the side of the computing device as opposed to from underneath. The exhaust heat is directed out of the top of the computing device, for example, through the keyboard void, speaker holes or a purpose-provided vent location.

In an alternative embodiment, a supplementary cooling system may be initiated to balance and reduce temperatures. In one embodiment and example, in the form of a secondary fan or standby fan which has not been used regularly and thus is clear of potential obstructions including, but not limited to, pet dander, hair, dust, etc.

Figure 3:
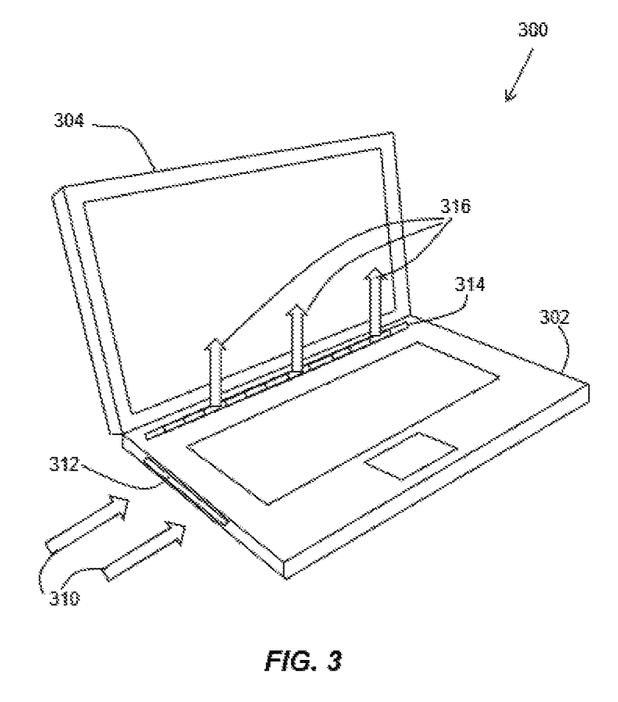
FIG. 3 is a perspective view of a computing device in accordance with an exemplary embodiment of the present invention.

FIG. 3 is a schematic diagram of an example computing device 300 and is shown in an open configuration. The computing device 300 has a housing 302 formed of a base part which is connected to a screen 304 by a hinge. In various embodiments, heat generating hardware may be provided within housing 302 in association with a cooling system for cooling the heat generating hardware via inlet 312 into and out of airduct 316 of housing 302.

In various embodiments, an airflow 310 into computing device 300 is shown through a side inlet 312 in housing 302, wherein the airflow 310 is directed out of the housing 302 through vents 314, wherein vents 314 is adjacent to the hinge with the screen 304. This provides venting of airflow 310 upwards through airduct 316 from a cooling system within housing 302 that may be activated as an overheating precautionary measure.

In various embodiments, the overheating precautionary measure is used to expel airflow upwards through airduct 316 if the computing device is being used on a soft surface, such as a bed, and the user does not want to restrict the hardware operating performance. In one embodiment and example, airflow 310 is redirected out through airduct 316 if a user is watching a film that utilizes a high amount of graphics processing.

Figure 4:
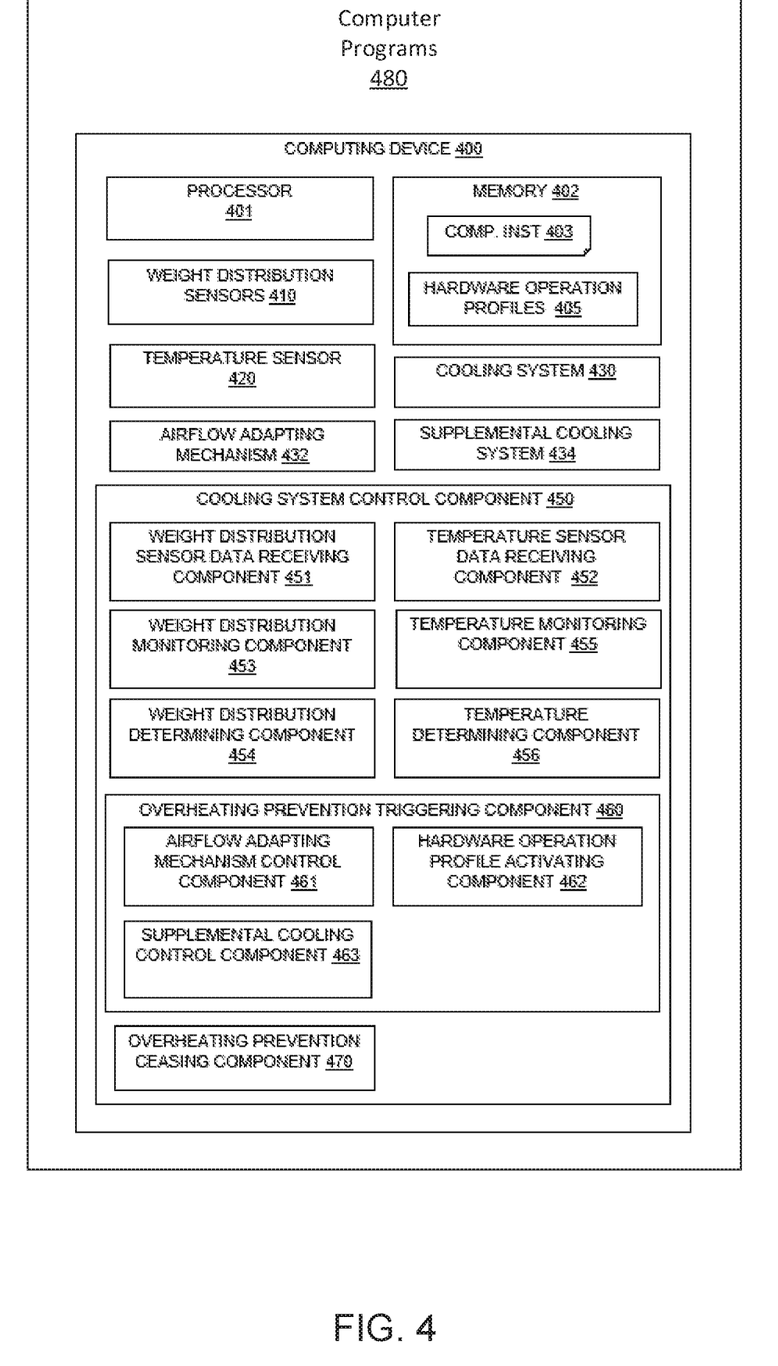
FIG. 4 is block diagram of an example embodiment of a system for a cooling system control for a computing device, in accordance with an exemplary embodiment of the present invention.

FIG. 4, a block diagram illustrating an example embodiment of components of computing device 400.

In various embodiments, computing device 400 includes, but is not limited to, one processor 401, a hardware module, or a circuit for executing the functions of the described components which may be software units executing on the at least one processor. Memory 402 may be configured to provide computer instructions 403 to the at least one processor 401 to carry out the functionality of the components.

In various embodiments, memory 402 may include computer instructions 403 for hardware operation profiles 405 to control the hardware components such as processor 401 to limit the heat generated by the hardware components. The operating system may have pre-defined and customizable hardware operation profiles 405 such as high performance, balanced, energy saver, etc.

In various embodiments, computing device 400 includes cooling system 430 in the form of a cooling mechanism which includes, but is not limited to, a fan, etc. provided in a housing of computing device 400. In some embodiments, an airflow adapting mechanism 432 may be provided within the housing for changing the direction of the airflow for ventilation for cooling system 430. Computing device 400 may also include, but is not limited to, a supplemental cooling system 434 in addition to a main cooling system providing extra cooling facility that may use a different airflow path for ventilation.

In various embodiments, computing device 400 may include a one or more weight distribution sensors 410 displaced throughout the base of the housing of computing device 400 and a temperature sensor 420 is provided within the housing of computing device 400. In one embodiment, the weight distribution sensors 410 are pressure sensors for measuring a pressure exerted by the computing device 400 at different regions of the base of the housing of computing device 400.

In various embodiments, computing device 400 includes a cooling system control component 450 for cooling control based on a surface on which the computing device 400 is resting. In some embodiments, the cooling system control component 450 may include a weight distribution sensor data receiving component 451 for receiving data from the weight distribution sensors 410 and a temperature sensor data receiving component 452 for receiving data from the temperature sensor 420. In alternative embodiments, the cooling system control component 450 may include a weight distribution monitoring component 453 for monitoring the computing device's weight distribution from data received from the weight distribution sensors 410 and a weight distribution determining component 454 for determining that the weight distribution is uneven for a defined period of time.

In various embodiments, the weight distribution determining component 454 may compare weight data from each of the plurality of weight distribution sensors 410 to determine weight differences between the sensors and determining if a weight difference is greater than a threshold difference for a sustained period of time.

In various embodiments, the cooling system control component 450 may include a temperature monitoring component 455 for monitoring a temperature of the computing device 400 from data received from the temperature sensor 420 and a temperature determining component 456 for determining that the temperature exceeds defined thresholds temperature. Alternatively, the cooling system control component 450 may include an overheating prevention triggering component 460 for triggering overheating prevention measures based on the output of the weight distribution determining component 454 and the temperature determining component 456. The overheating prevention triggering component 460 may include a hardware operation profile activating component 462 for activating one of the hardware operation profiles 405, an airflow adapting mechanism control component 461 for activating the airflow adapting mechanism 432, and a supplemental cooling control component 463 for activating the supplemental cooling system 434.

In some embodiments, the cooling system control component 450 may include an overheating prevention ceasing component 470 for ceasing an overheating prevention measure activated by the overheating prevention triggering component 460.

Figure 5:
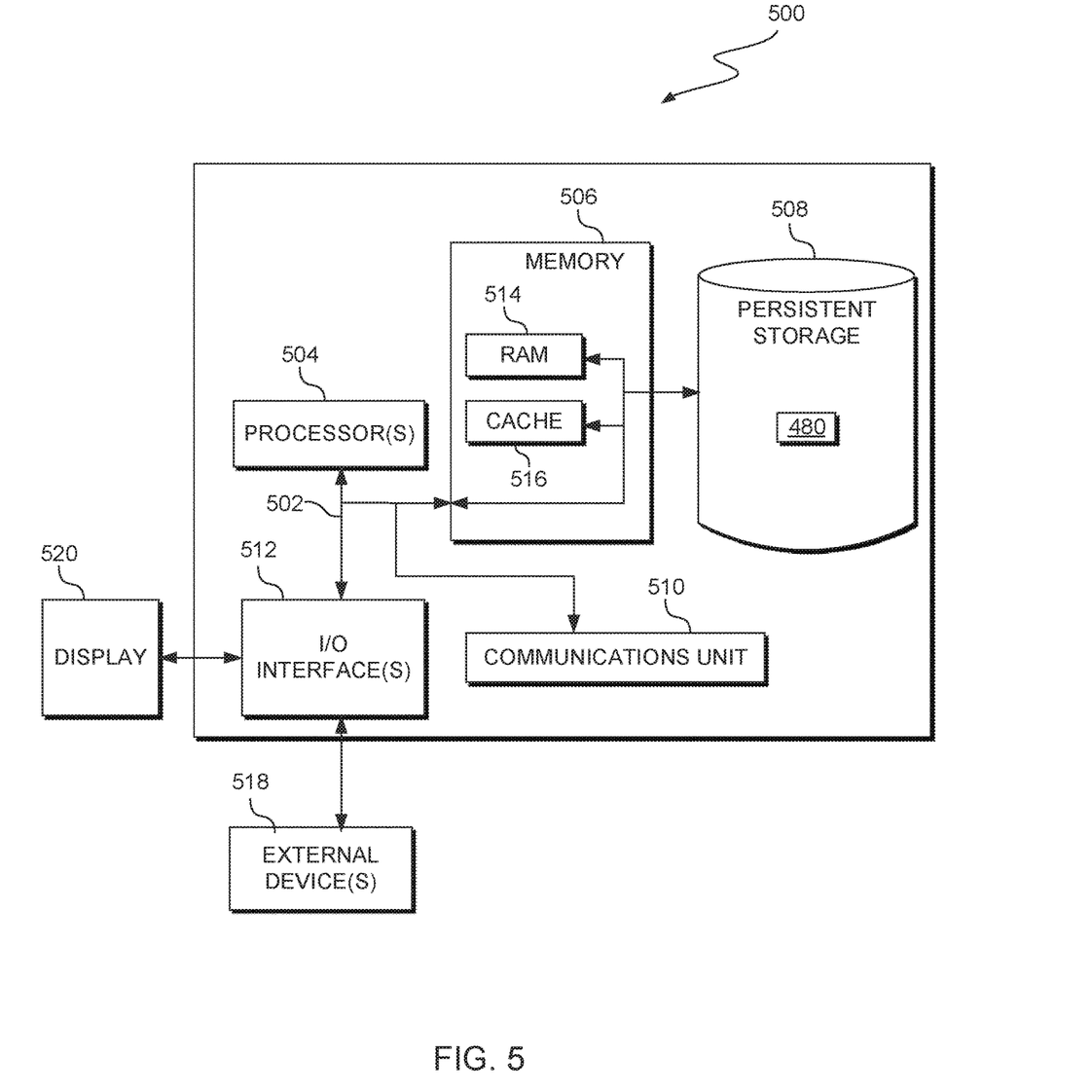
FIG. 5 depicts a block diagram of components of one or more computing devices, in accordance with an exemplary embodiment of the present invention.

FIG. 5 depicts a block diagram, 500, of components of computing device 400, in accordance with an illustrative embodiment of the present invention. It should be appreciated that FIG. 5 provides only an illustration of one implementation and does not imply any limitations with regard to the environments in which different embodiments may be made.

Computing device 400 includes communications fabric 502, which provides communications between computer processor(s) 504, memory 506, persistent storage 508, communications unit 510, and input/output (I/O) interface(s) 512. Communications fabric 502 can be implemented with any architecture designed for passing data and/or control information between processors (such as microprocessors, communications and network processors, etc.), system memory, peripheral devices, and any other hardware components within a system. For example, communications fabric 502 can be implemented with one or more buses.

Memory 506 and persistent storage 508 are computer-readable storage media. In this embodiment, memory 506 includes random access memory (RAM) 514 and cache memory 516. In general, memory 506 can include any suitable volatile or non-volatile computer-readable storage media.

Computer programs 480 are stored in persistent storage 508 for execution and/or access by one or more of the respective computer processors 504 via one or more memories of memory 506. In this embodiment, persistent storage 508 includes a magnetic hard disk drive. Alternatively, or in addition to a magnetic hard disk drive, persistent storage 508 can include a solid state hard drive, a semiconductor storage device, read-only memory (ROM), erasable programmable read-only memory (EPROM), flash memory, or any other computer-readable storage media that is capable of storing program instructions or digital information.

The media used by persistent storage 508 may also be removable. For example, a removable hard drive may be used for persistent storage 508. Other examples include optical and magnetic disks, thumb drives, and smart cards that are inserted into a drive for transfer onto another computer-readable storage medium that is also part of persistent storage 508.

Communications unit 510, in these examples, provides for communications with other data processing systems or devices, including resources over a network. In these examples, communications unit 510 includes one or more network interface cards. Communications unit 510 may provide communications through the use of either or both physical and wireless communications links. Computer programs 480 may be downloaded to persistent storage 508 through communications unit 510.

I/O interface(s) 512 allows for input and output of data with other devices that may be connected to computing device 400. For example, I/O interface 512 may provide a connection to external devices 518 such as a keyboard, keypad, a touch screen, and/or some other suitable input device. External devices 518 can also include portable computer-readable storage media such as, for example, thumb drives, portable optical or magnetic disks, and memory cards. Software and data used to practice embodiments of the present invention, e.g., computer programs 480, can be stored on such portable computer-readable storage media and can be loaded onto persistent storage 508 via I/O interface(s) 612. I/O interface(s) 512 also connect to a display 520.

Display 520 provides a mechanism to display data to a user and may be, for example, a computer monitor, or a television screen.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the FIGS. illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the FIGS. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The programs described herein are identified based upon the application for which they are implemented in a specific embodiment of the invention. However, it should be appreciated that any particular program nomenclature herein is used merely for convenience, and thus the invention should not be limited to use solely in any specific application identified and/or implied by such nomenclature.

It is to be noted that the term(s) such as, for example, "Smalltalk" and the like may be subject to trademark rights in various jurisdictions throughout the world and are used here only in reference to the products or services properly denominated by the marks to the extent that such trademark rights may exist.

Improvements and modifications can be made to the foregoing without departing from the scope of the present invention.

What is claimed is:

1. A computer-implemented method for control of a cooling system, the method comprising:
   monitoring a weight distribution of a computing device based on data received from a plurality of pressure sensors arranged on a base of the computing device, the pressure sensors supporting the computing device when oriented in an in-use position and measuring pressure exerted by the computing device at different regions of the base of the computing device;
   determining the weight distribution by distinguishing measured pressure among the plurality of sensors such that a first uneven weight distribution among the plurality of sensors is determined at a first time;
   determining the weight distribution by distinguishing measure pressure among the plurality of sensors such that a second uneven weight distribution among the plurality of sensors is determined at a defined period of time after the first time, the second uneven weight distribution being different than the first uneven weight distribution; and
   responsive to determining the second uneven weight distribution is different than the first uneven weight distribution, executing a first overheating prevention measure, wherein the first overheating prevention measure redirects an exit airflow from a lateral direction through the side of the computing device to an upward direction.

2. The computer-implemented method of claim 1, the method further comprising:
   monitoring a temperature of the computing device from data received from a temperature sensor within a housing of the computing device;
   determining at a third time that the temperature exceeds a threshold temperature; and
   triggering a second overheating prevention measure using a hardware operation profile to reduce heat generation.

3. The computer-implemented method of claim 2, the method further comprising:
   determining at a fourth time the temperature is below the threshold temperature, the fourth time being later in time than the third time; and
   ceasing the first overheating prevention measure and the second overheating prevention measure.

4. The computer-implemented method of claim 2, wherein using the hardware operation profile to reduce heat generation includes:
   reducing processing power of the computing device.

5. The computer-implemented method of claim 1, wherein the first overheating prevention measure further includes initiating the execution of a cooling mechanism in the computing device.

6. A computer system, the computer system comprising:
one or more computer processors;
one or more computer readable storage medium; and
program instructions stored on the computer readable storage medium for execution by at least one of the one or more processors, the stored program instructions comprising:
program instructions to monitor a weight distribution of a computing device based on data received from a plurality of pressure sensors arranged on a base of the computing device, the pressure sensors supporting the computing device when oriented in an in-use position and measuring pressure exerted by the computing device at different regions of the base of the computing device;
program instructions to determine the weight distribution by distinguishing measured pressure among the plurality of sensors such that a first uneven weight distribution among the plurality of sensors is determined at a first time;
program instructions to determine the weight distribution by distinguishing measure pressure among the plurality of sensors such that a second uneven weight distribution among the plurality of sensors is determined at a defined period of time after the first time, the second uneven weight distribution being different than the first uneven weight distribution; and
program instructions to, responsive to determining the second uneven weight distribution is different than the first uneven weight distribution, execute a first overheating prevention measure wherein the first overheating prevention measure redirects an exiting airflow from a lateral direction through the side of the computing device to an upward direction.

7. The computer system of claim 6, the stored program instructions further comprising:
program instructions for monitoring a temperature of the computing device from data received from a temperature sensor within a housing of the computing device;
program instructions for determining at a third time the temperature exceeds a threshold temperature; and
program instructions for triggering a second overheating prevention measure using a hardware operation profile to reduce heat generation.

8. The computer system of claim 7, the stored program instructions further comprising:
program instructions for determining at a fourth time the temperature is below the threshold temperature, the fourth time being later in time than the third time; and
program instructions for ceasing the first overheating prevention measure and the second overheating prevention measure.

9. The computer system of claim 7, wherein using the hardware operation profile to reduce heat generation includes:
program instructions to reduce processing power of the computing device.

10. The computer system of claim 6, wherein the first overheating prevention measure further includes initiating the execution of a cooling mechanism in the computing device.

11. A computer program product, the computer program product comprising:
one or more computer-readable storage media and program instructions stored on the one or more computer-readable storage media, the stored program instructions comprising:
program instructions to monitor a weight distribution of a computing device based on data received from a plurality of pressure sensors arranged on a base of the computing device, the pressure sensors supporting the computing device when oriented in an in-use position and measuring pressure exerted by the computing device at different regions of the base of the computing device;
program instructions to determine the weight distribution by distinguishing measured pressure among the plurality of sensors such that a first uneven weight distribution among the plurality of sensors is determined at a first time;
program instructions to determine the weight distribution by distinguishing measure pressure among the plurality of sensors such that a second uneven weight distribution among the plurality of sensors is determined at a defined period of time after the first time, the second uneven weight distribution being different than the first uneven weight distribution; and
program instructions to, responsive to determining the second uneven weight distribution is different than the first uneven weight distribution, execute a first overheating prevention measure wherein the first overheating prevention measure redirects an exiting airflow from a lateral direction through the side of the computing device to an upward direction.

12. The computer program product of claim 11, the stored program instructions further comprising:
program instructions for monitoring a temperature of the computing device from data received from a temperature sensor within a housing of the computing device;
program instructions for determining at a third time the temperature exceeds a threshold temperature; and
program instructions for triggering a second overheating prevention measure using a hardware operation profile to reduce heat generation.

13. The computer program product of claim 12, the stored program instructions further comprising:
program instructions for determining at a fourth time the temperature is below the threshold temperature, the fourth time being later in time than the third time; and
program instructions for ceasing the first overheating prevention measure and the second overheating prevention measure.

14. The computer program product of claim 12, wherein using the hardware operation profile to reduce heat generation includes:
program instructions to reduce processing power of the computing device.

15. The computer program product of claim 11, wherein the first overheating prevention measure further includes initiating the execution of a cooling mechanism in the computing device.

16. The computer program product of claim 11, wherein the pressure sensors measure a pressure exerted by the computing device at different regions of the base when supporting the computing device.

17. The computer program product of claim 11, the stored program instructions further comprising:
program instructions for a secondary cooling mechanism for providing additional cooling for the interior of the housing of the computing device, wherein the secondary cooling mechanism is controlled by a cooling system control component.

\* \* \* \* \*